US 6,661,638 B2

(12) United States Patent
Jackson et al.

(10) Patent No.: US 6,661,638 B2
(45) Date of Patent: Dec. 9, 2003

(54) CAPACITOR EMPLOYING BOTH FRINGE AND PLATE CAPACITANCE AND METHOD OF MANUFACTURE THEREOF

(75) Inventors: Robert Jackson, Grayson, GA (US); Abner D. Joseph, Carmel, IN (US); Don S. Terry, Lawrenceville, GA (US); Perry K. White, Indianapolis, IN (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

(21) Appl. No.: 10/008,366

(22) Filed: Dec. 7, 2001

(65) Prior Publication Data

US 2003/0107869 A1 Jun. 12, 2003

(51) Int. Cl.[7] .................... H01G 4/005; H01G 4/228
(52) U.S. Cl. ............. 361/303; 361/306.2; 29/25.42
(58) Field of Search .................. 361/301.4, 303, 361/304, 306.1, 306.2, 306.3, 311, 320; 29/25.42

(56) References Cited

U.S. PATENT DOCUMENTS 5,583,359 A  * 12/1996  Ng et al. ................ 257/306

FOREIGN PATENT DOCUMENTS

JP           9-186048    *  7/1997  ............ H01G/4/30

* cited by examiner

Primary Examiner—Dean A. Reichard
Assistant Examiner—Eric Thomas

(57) ABSTRACT

For use in a printed wiring board, a capacitor, and a method of manufacturing the capacitor. In one embodiment, the capacitor includes: (1) first and second interdigitated finger sets, located on a first layer of the printed wiring board, that employ fringe capacitance to store electrical energy and together form a first capacitor conductor and (2) a second capacitor conductor, located on a second layer of the printed wiring board, that cooperates with the first capacitor conductor to employ plate capacitance to store further electrical energy.

21 Claims, 4 Drawing Sheets

CAPACITOR EMPLOYING BOTH FRINGE AND PLATE CAPACITANCE AND METHOD OF MANUFACTURE THEREOF

TECHNICAL FIELD OF THE INVENTION

The present invention is directed, in general, to capacitor structures and, more specifically, to a capacitor, operable with a printed wiring board, that employs both fringe and plate capacitance, a method of manufacturing the same and a jack assembly, employing such capacitor, that is useful in enterprise structured cabling systems.

BACKGROUND OF THE INVENTION

Capacitors are among the oldest known electronic components. Those skilled in the art know and appreciate how capacitors may be used alone or in circuits of various types to in route, filter, modify and block electrical currents.

Capacitors are made up of two or more capacitor conductors that are separated by an insulator (or "dielectric" material). When a voltage difference exists between the two capacitor conductors, a corresponding electromagnetic field is formed. The electromagnetic field serves as a medium for containing electrical energy. The electrical energy can be drawn from the field via the conductors. The size and shape of the capacitor conductors and the extent to which the dielectric material electrically separates them from one another are factors in determining how much electrical energy can be stored in the electromagnetic field.

Printed wiring boards (PWBs) have long proven useful as substrates for circuits of all types. (PWBs may also be known as "printed circuit boards," or "PCBs." The terms are interchangeable for purposes of the present discussion). A PWB is often formed of a dielectric material on or in which are one or more layers of conductive material. The layer is typically arranged in a pattern to yield specific electrical conductors. Electrical components (including capacitors) can be mounted on the PWB and joined to the electrical conductors to form desired circuits.

Those skilled in the art know that capacitors can also be formed in the PWBs themselves, and quite inexpensively. Recalling that a capacitor is formed by at least two capacitor conductors separated by a dielectric material, it is straightforward to contemplate two ways to form a capacitor in a PWB.

The first way is to form two separate layers on or in the PWB and place a capacitor conductor on each layer. Viewing the PWB in a horizontal orientation, the capacitor conductors lie vertically over one another, and the dielectric material that separates the layers also separates the capacitor conductors. Capacitors thus formed are often called "plate capacitors," because their capacitor conductors take advantage of the capacitance that exists between parallel planar conductors ("plate capacitance").

The second way is to place the capacitor conductors on the same layer, but separate them laterally from one another. The gap that lies between the capacitor conductors serves as the dielectric material for the resulting capacitor. These capacitors are called "edge capacitors" or "fringe capacitors," because the fringes of the capacitor conductors predominantly contribute to their capacitance.

A wide variety of today's applications require capacitors having highly accurate capacitance values. While discrete capacitor components can be employed in some of these applications, routing traces to and around discrete components may effectively prevent their use. Still other applications are severely cost- or space-sensitive and cannot justify the expense of discrete capacitor components.

At first glance, PWB-based capacitors of the type described above would seem readily to offer the answer to these types of applications, but limitations inherent in conventional PWB manufacturing processes have significantly complicated the fabrication of highly accurate PWB capacitors.

For example, any variation in plate size, thickness or separation can alter plate capacitance. Variations in the extent to which the plates are separated cause particularly dramatic changes in plate capacitance. Variations in gap have the same effect in fringe capacitors. Misregistration, etching depth variations, PWB laminate thickness variations, variations in conductive layer thickness and unpredictability of the dielectric constant of dielectric materials all contribute to potential inaccuracy and unacceptable rejection rates for such capacitors.

Accordingly, what is needed in the art is a fundamentally new architecture for PWB-based capacitors that is less sensitive to variations during fabrication than those of the prior art. What is also needed in the art is inexpensive communication circuitry that includes such capacitors.

SUMMARY OF THE INVENTION

To address the above-discussed deficiencies of the prior art, the present invention provides, for use in a printed wiring board, a capacitor, and a method of manufacturing the capacitor. In one embodiment, the capacitor includes: (1) first and second interdigitated finger sets, located on a first layer of the printed wiring board, that employ fringe capacitance to store electrical energy and together form a first capacitor conductor and (2) a second capacitor conductor, located on a second layer of the printed wiring board, that cooperates with the first capacitor conductor to employ plate capacitance to store further electrical energy.

The present invention therefore introduces a hybrid capacitor that employs both fringe and plate capacitance to provide an overall capacitance that is more tightly controllable and therefore suitable for use in circuits such as jack assemblies for computer network cables that require accurate and inexpensive capacitors.

In one embodiment of the present invention, the first and second interdigitated finger sets are square. The meaning of "square" will become evident upon inspection of one embodiment hereinafter to be illustrated and described. Those skilled in the pertinent art should understand, however, that other configurations are within the broad scope of the present invention.

In one embodiment of the present invention, the second capacitor conductor comprises third and fourth interdigitated finger sets. Thus, the second plate may itself employ fringe capacitance. In a more specific embodiment, the first and second interdigitated finger sets and the third and fourth interdigitated finger sets are laterally offset with respect to one another. Of course, the sets may be aligned over one another.

In one embodiment of the present invention, the capacitor further includes a third capacitor conductor, located on a third layer of the printed wiring board, that cooperates with the first and second capacitor conductors to employ the plate capacitance to store still further electrical energy. In a more specific embodiment, the third capacitor conductor comprises third and fourth interdigitated finger sets. In a still more specific embodiment, the capacitor further includes a fourth capacitor conductor, located on a fourth layer of the printed circuit board, that cooperates with the first, second and third capacitor conductors to employ the plate capacitance to store yet still further electrical energy. These and other embodiments will be illustrated and described in the Detailed Description that follows.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
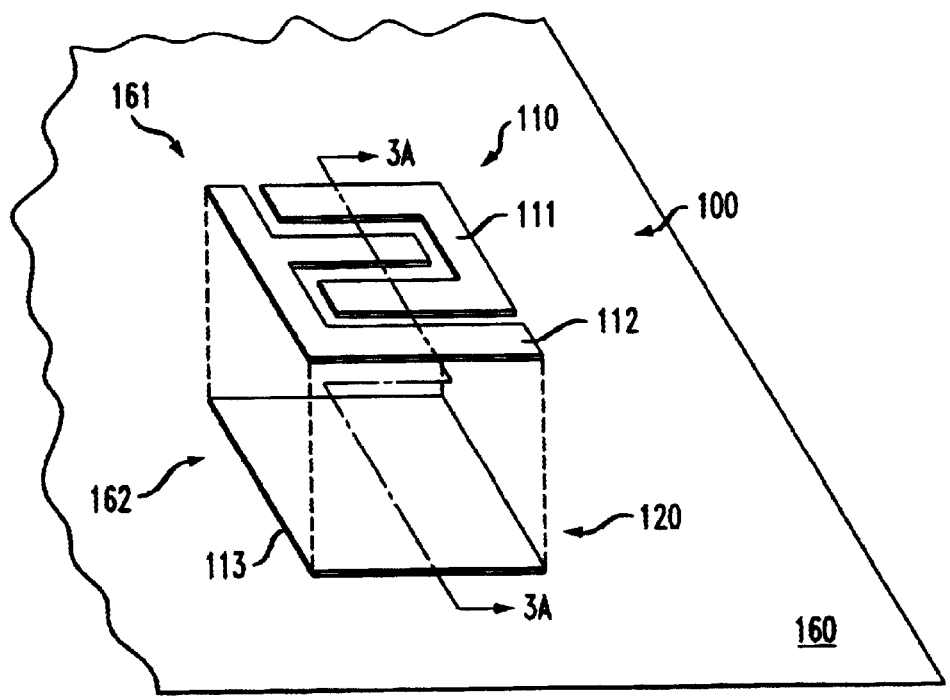
FIG. 1 illustrates an exploded isometric view of one embodiment of a two-layer capacitor constructed according to the principles of the present invention.

Referring initially to FIG. 1, illustrated is an exploded isometric view of one embodiment of a two-layer capacitor constructed according to the principles of the present invention.

The capacitor, generally designated 100, has a first capacitor conductor 110. The first capacitor conductor 110 includes a first finger set 111 and a second finger set 112 that is interdigitated with the first finger set 111. The first capacitor conductor 110 is located on a first layer 161 of a PWB 160. The first and second interdigitated finger sets 111, 112 employ fringe capacitance (in a manner that is well known by those skilled in the pertinent art) to store electrical energy, and therefore cooperate to form a fringe capacitor in the first layer 161. However, unlike the prior art, the first and second interdigitated finger sets 111, 112 also cooperate together to form a first capacitor conductor.

FIG. 1 also shows a second capacitor conductor 120, located on a second layer 162 of the PWB 160. The second capacitor conductor 120, which in FIG. 1 takes the form of a plate 113, cooperates with the first capacitor conductor 110 (comprising the first and second interdigitated finger sets 111, 112) to employ plate capacitance (in a manner that is well known to those skilled in the pertinent art) to store further electrical energy, and therefore cooperate to form a plate capacitor in both the first and second layers 161, 162.

To achieve this cooperation, the first finger set 111 forms one terminal of the capacitor 100 and the second finger set 112 forms the other terminal. The second capacitor conductor 120 may be connected in parallel exclusively with either the first finger set 111 or the second finger set 112.

The net result is that the two layer capacitor 100 of FIG. 1 employs both fringe and plate capacitance to store it electrical energy. A significant advantage of employing both fringe and plate capacitance to store electrical energy is that manufacturing processes that effect the thickness, lateral dimensions and separation of the first and second interdigitated finger sets 111, 112 and the second capacitor conductor 120 can be controlled at least somewhat independently to yield a capacitor having a more controllable capacitance. This allows the capacitor 100 (which is relatively inexpensive to manufacture) to be employed in a wide range of applications (such as jack assemblies) that require accurate capacitors.

In the embodiment illustrated in FIG. 1, the first and second interdigitated finger sets 111, 112 are square. A square configuration is characterized by an overall square perimeter for the first conductor and finger sets that are straight and parallel to one another. Of course, the present invention encompasses configurations that are curved or of any shape that a particular application may find useful.

Figure 2:
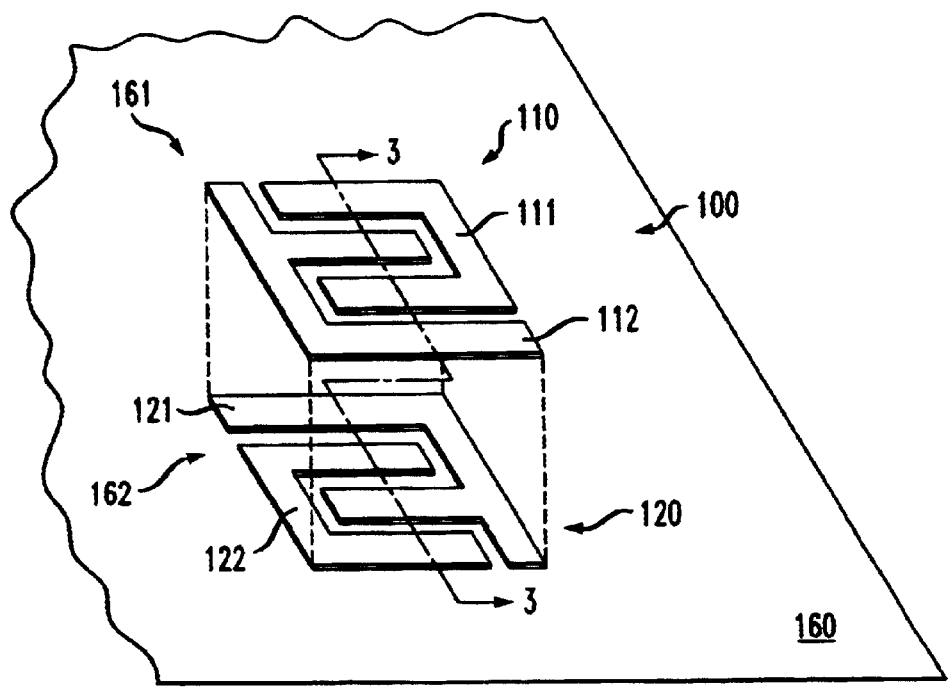
FIG. 2 illustrates an exploded isometric view of another embodiment of a two-layer capacitor constructed according to the principles of the present invention.

Turning now to FIG. 2, illustrated is an exploded isometric view of another embodiment of a two-layer capacitor 100 constructed according to the principles of the present invention. In the embodiment of FIG. 2, the second capacitor conductor comprises third and fourth interdigitated finger sets 121, 122. Thus, the second capacitor conductor 120 may itself employ fringe capacitance as between the third and fourth interdigitated finger sets 121, 122.

In terms of electrical connections, the first finger set 111 forms one terminal of the capacitor 100 and the second finger set 112 forms the other terminal of the capacitor 100. The third finger set 121 may be connected in parallel exclusively with either the first finger set 111 or the second finger set 112. The fourth finger set 122 may be connected in parallel exclusively with the other of the first finger set 111 or the second finger set 112.

At this point, it becomes more helpful to view exemplary capacitor configurations more schematically. Accordingly, turning now to FIGS. 3A–3E, illustrated are schematic views of the capacitors of FIGS. 1 and 2, together with various other alternative embodiments of multi-layer capacitors constructed according to the principles of the present invention.

Figure 3A:
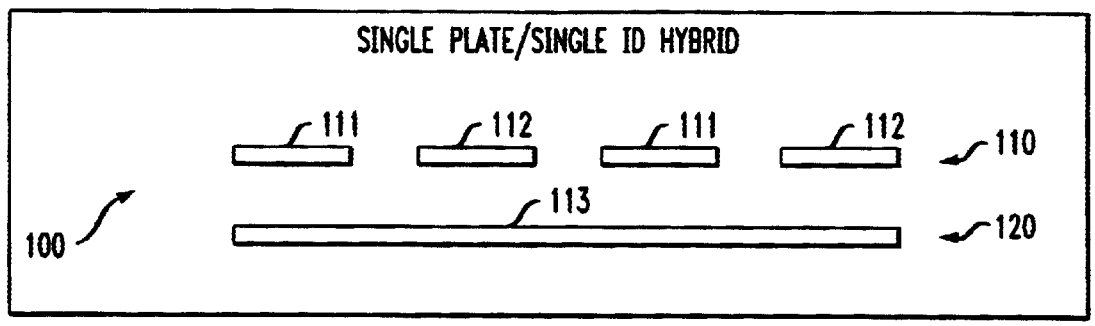
FIGS. 3A–3E illustrate schematic views of the capacitors of FIGS. 1 and 2, together with various other alternative embodiments of multi-layer capacitors constructed according to the principles of the present invention.
Figure 3B:
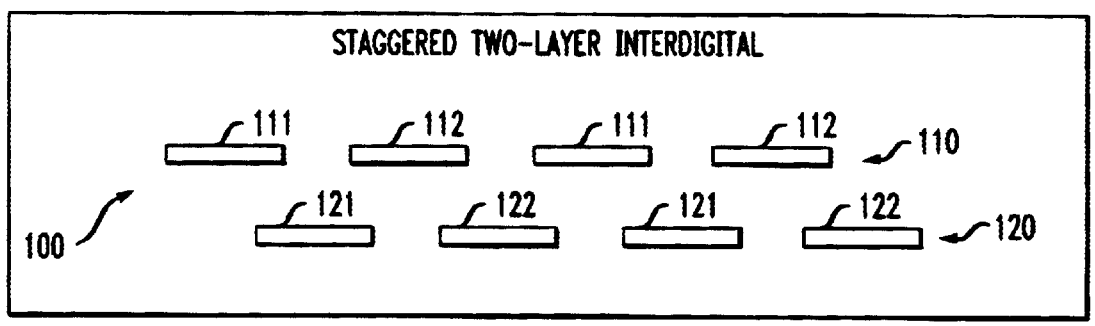

The capacitor 100 of FIG. 1 is schematically represented in FIG. 3A, which is taken along lines 3A—3A of FIG. 1. The capacitor 100 of FIG. 2 is schematically represented in FIG. 3B, which is taken along lines 3B—3B of FIG. 2. From FIGS. 3A and 3B, it is apparent when a capacitor conductor takes the form of interdigitated finger sets or a solid plate.

It is also apparent from FIG. 3B that the third and fourth interdigitated finger sets 121, 122 are laterally offset, or staggered, with respect to the first and second interdigitated finger sets 111, 112. The lateral offset may be in any suitable direction and of any suitable distance. A lateral offset, however, is not required. The third and fourth interdigitated finger sets 121, 122 may instead lie directly beneath the first and second interdigitated finger sets 111, 112.

The fingers of the third and fourth interdigitated finger sets 121, 122 may also be perpendicular with respect to the fingers of the first and second interdigitated finger sets 111, 112. Rotation of the third and fourth interdigitated finger sets 121, 122 with respect to the first and second interdigitated finger sets 111, 112 is not necessary of course, and any degree of rotation falls within the broad scope of the present invention.

Figure 3C:
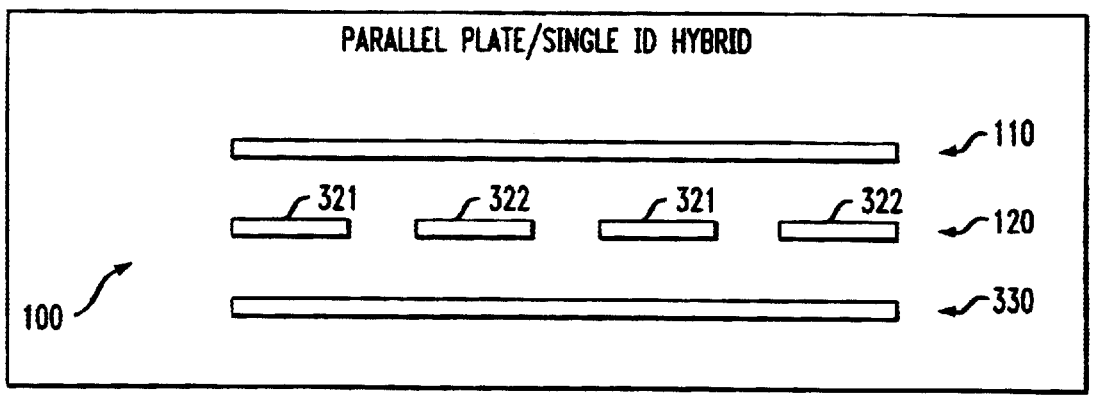

FIG. 3C illustrates a three-layer capacitor 100, demonstrating that a capacitor constructed according to the principles of the present invention may encompass more than two PWB layers. In the capacitor 100 of FIG. 3C, the first capacitor conductor 110 takes the form of a plate, the second capacitor conductor 120 takes the form of interdigitated finger sets 321, 322 and a third capacitor conductor 330 underlies the second capacitor conductor 120 and takes the form of a plate. The first capacitor conductor 110 may form one terminal of the capacitor 100 and the third capacitor conductor 330 may form the other terminal of the capacitor 100. One of the interdigitated finger sets 321, 322 of the second capacitor conductor 120 may be connected in parallel exclusively with the first capacitor conductor 110, and the other of the interdigitated finger sets 321, 322 may be connected in parallel exclusively with the third capacitor conductor 330.

Figure 3D:
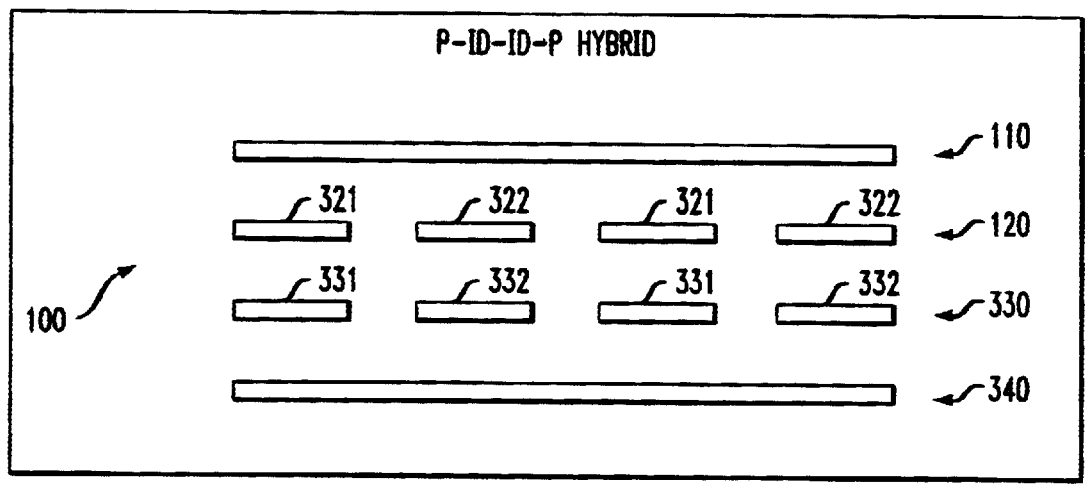

FIG. 3D illustrates a four-layer capacitor 100. In the capacitor 100 of FIG. 3D, the first capacitor conductor 110 takes the form of a plate, the second capacitor conductor 120 takes the form of interdigitated finger sets 321, 322, the third capacitor conductor 330 takes the form of interdigitated finger sets 331, 332 and a fourth capacitor conductor 340 underlies the third capacitor conductor 330 and takes the form of a plate. The first capacitor conductor 110 may form one terminal of the capacitor 100 and the fourth capacitor conductor 340 may form the other terminal of the capacitor 100. One of the interdigitated finger sets 321, 322 of the second capacitor conductor 120 and one of the interdigitated finger sets 331, 332 of the third capacitor conductor 330 may be connected in parallel exclusively with the first capacitor conductor 110, and the other of the interdigitated finger sets 321, 322 and the interdigitated finger sets 331, 332 may be connected in parallel exclusively with the fourth capacitor conductor 340.

Figure 3E:
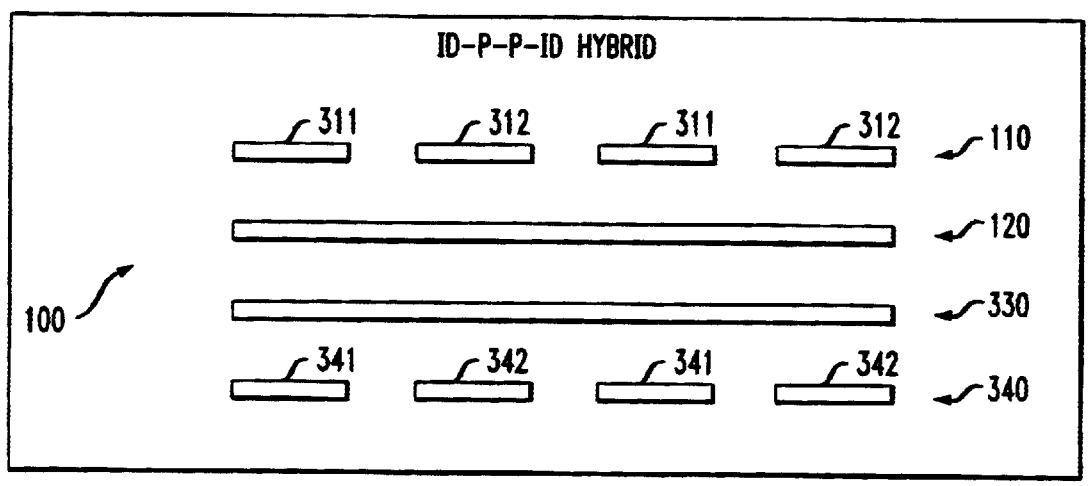

FIG. 3E also illustrates a four-layer capacitor 100. In the capacitor 100 of FIG. 3E, the first capacitor conductor 110 takes the form of interdigitated finger sets 311, 312, the second and third capacitor conductors 120 each take the form of a plate and the fourth capacitor conductor 340 takes the form of interdigitated finger sets 341, 342. The second capacitor conductor 120 may form one terminal of the capacitor 100 and the third capacitor conductor 330 may form the other terminal of the capacitor 100. One of the interdigitated finger sets 311, 312 of the first capacitor conductor 110 and one of the interdigitated finger sets 341, 342 of the fourth capacitor conductor 340 may be connected in parallel exclusively with the second capacitor conductor 120, and the other of the interdigitated finger sets 311, 312 and the interdigitated finger sets 341, 342 may be connected in parallel exclusively with the third capacitor conductor 330.

Figure 4:
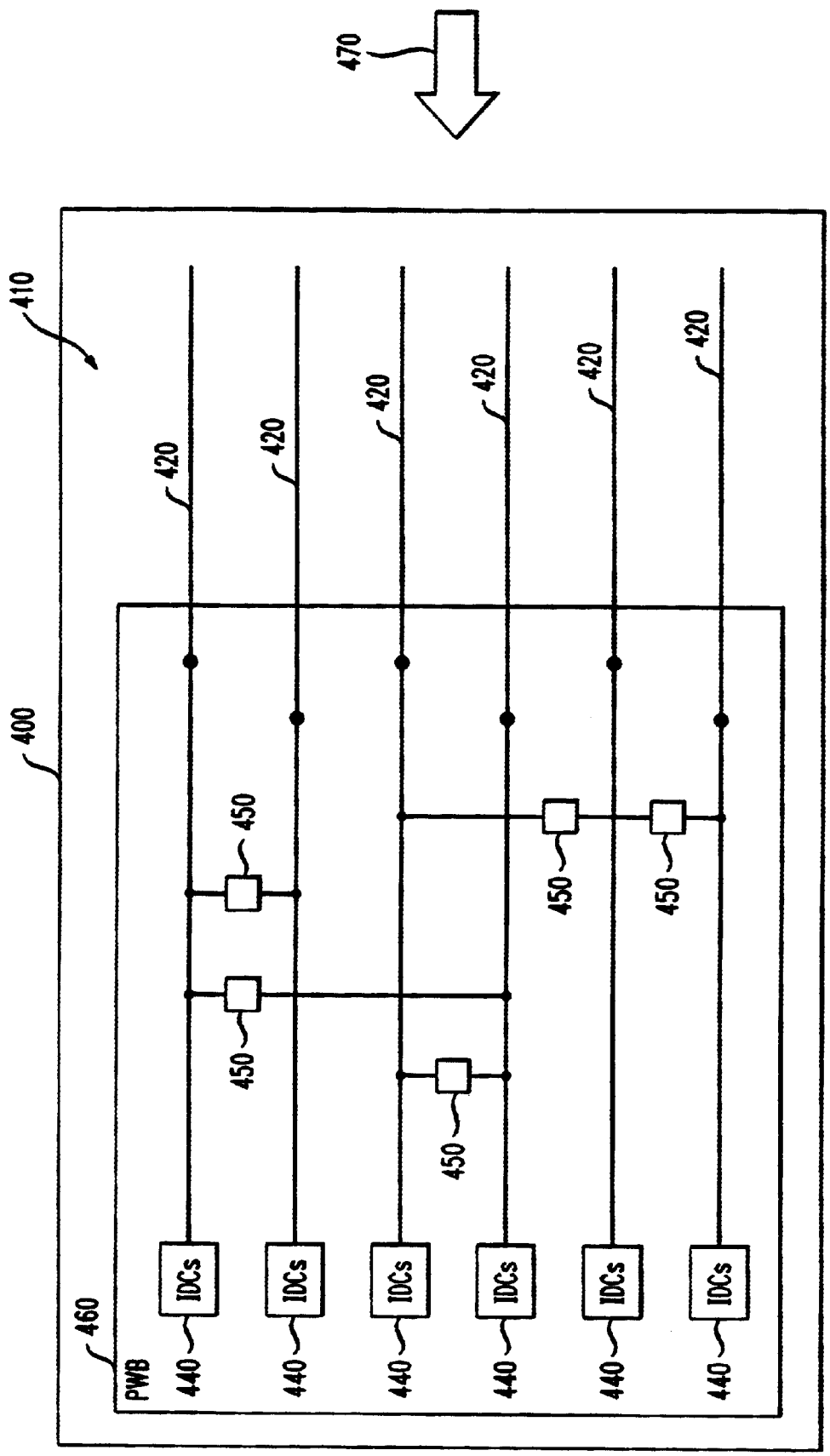
FIG. 4 illustrates a plan view of a jack assembly that incorporates at least one capacitor constructed according to the principles of the present invention.

Turning now to FIG. 4, illustrated is a plan view of a jack assembly that incorporates at least one capacitor constructed according to the principles of the present invention. The jack assembly, generally designated 400, includes a lead frame 410 to which lead stock 420 is coupled. The lead stock 420 terminates in a PWB 460. As those skilled in the art are aware, the lead stock 420 extends into a receptacle (not shown) and is resilient and designed to bear against corresponding conductors in a plug (not shown) when that plug is inserted into the jack assembly 400. Insulation displacement connectors (IDCs) 440 allow the lead stock to be electrically connected to a cable (not shown but entering the jack assembly 400 as indicated by an arrow 470).

Parasitic capacitive coupling within the jack assembly 400 (caused in part by transmission line effects associated with the lead stock 420) may necessitate the use of accurate but inexpensive capacitors for purposes of producing balance signals of opposite polarity. Accordingly, some exemplary capacitors 450 are located on the PWB 460. These capacitors 450 couple various leads of the jack assembly 400 together to countervail the parasitic capacitive coupling. Those skilled in the art should understand that the number, value, location and configuration of the capacitors 450 depend upon the design of the jack assembly 400.

Manufacturing a capacitor according to the principles of the present invention is straightforward. First, first and second interdigitated finger sets are formed on a first layer of a PWB according to any appropriate conventional or later-discovered technique. The first and second interdigitated finger sets are located close to one another such that fringe capacitance between the two causes electrical energy to be stored. Next, a second capacitor conductor is formed on a second layer of the PWB. Because the second layer is separated from the first layer, the second capacitor conductor cooperates with the first capacitor conductor (made up of the first and second interdigitated finger sets) to employ plate capacitance to store further electrical energy.

If so desired, further (e.g., third, fourth or more) layers of capacitor conductors may be formed on corresponding further layers of the PWB. These further capacitor conductors may each take the form of plates or interdigitated finger sets, as is desired. The conductors thus formed may then be electrically connected to one another to yield a capacitor.

In closing, it should be noted that the first, second, third, fourth and further layers called out herein need not be in any particular order and need not be adjacent one another.

Although the present invention has been described in detail, those skilled in the art should understand that they can make various changes, substitutions and alterations herein without departing from the spirit and scope of the invention in its broadest form.

What is claimed is:

1. For use in a printed wiring board, a capacitor, comprising:
    first and second interdigitated finger sets, located on a first layer of said printed wiring board, that employ fringe capacitance to store electrical energy and together form a first capacitor conductor; and
    a second capacitor conductor, located on a second layer of said printed wiring board, that cooperates with said first capacitor conductor to employ plate capacitance to store further electrical energy.

2. The capacitor as recited in claim 1 wherein said first and second interdigitated finger sets are square.

3. The capacitor as recited in claim 1 wherein said second capacitor conductor comprises third and fourth interdigitated finger sets.

4. The capacitor as recited in claim 3 wherein said first and second interdigitated finger sets and said third and fourth interdigitated finger sets are laterally offset with respect to one another.

5. The capacitor as recited in claim 1 further comprising a third capacitor conductor, located on a third layer of said printed wiring board, that cooperates with said first and second capacitor conductors to employ said plate capacitance to store still further electrical energy.

6. The capacitor as recited in claim 5 wherein said third capacitor conductor comprises third and fourth interdigitated finger sets.

7. The capacitor as recited in claim 6 further comprising a fourth capacitor conductor, located on a fourth layer of said printed wiring board, that cooperates with said first, second and third capacitor conductors to employ said plate capacitance to store yet still further electrical energy.

8. A method of manufacturing a capacitor in a printed wiring board, comprising:
   forming first and second interdigitated finger sets on a first layer of said printed wiring board, said first and second interdigitated finger sets employing fringe capacitance to store electrical energy and together form a first capacitor conductor; and
   forming a second capacitor conductor on a second layer of said printed wiring board, said second capacitor conductor cooperating with said first capacitor conductor to employ plate capacitance to store further electrical energy.

9. The method as recited in claim 8 wherein said first and second interdigitated finger sets are square.

10. The method as recited in claim 8 wherein said second capacitor conductor comprises third and fourth interdigitated finger sets.

11. The method as recited in claim 10 wherein said first and second interdigitated finger sets and said third and fourth interdigitated finger sets are laterally offset with respect to one another.

12. The method as recited in claim 8 further comprising forming a third capacitor conductor on a third layer of said printed wiring board, said third capacitor conductor cooperating with said first and second capacitor conductors to employ said plate capacitance to store still further electrical energy.

13. The method as recited in claim 12 wherein said third capacitor conductor comprises third and fourth interdigitated finger sets.

14. The method as recited in claim 13 further comprising forming a fourth capacitor conductor on a fourth layer of said printed wiring board, said fourth capacitor conductor cooperating with said first, second and third capacitor conductors to employ said plate capacitance to store yet still further electrical energy.

15. A jack assembly, comprising:
   a lead frame;
   finger stock located in said lead frame;
   a printed wiring board coupled to said lead frame and receiving said finger stock; and
   at least one capacitor, located in said printed wiring board and coupled to said finger stock, each of said at least one capacitor including:
      first and second interdigitated finger sets, located on a first layer of said printed wiring board, that employ fringe capacitance to store electrical energy and together form a first capacitor conductor and
      a second capacitor conductor, located on a second layer of said printed wiring board, that cooperates with said first capacitor conductor to employ plate capacitance to store further electrical energy.

16. The jack assembly as recited in claim 15 wherein said first and second interdigitated finger sets are square.

17. The jack assembly as recited in claim 15 wherein said second capacitor conductor comprises third and fourth interdigitated finger sets.

18. The jack assembly as recited in claim 17 wherein said first and second interdigitated finger sets and said third and fourth interdigitated finger sets are laterally offset with respect to one another.

19. The jack assembly as recited in claim 15 wherein said each of said at least one capacitor further includes a third capacitor conductor, located on a third layer of said printed wiring board, that cooperates with said first and second capacitor conductors to employ said plate capacitance to store still further electrical energy.

20. The jack assembly as recited in claim 19 wherein said third capacitor conductor comprises third and fourth interdigitated finger sets.

21. The jack assembly as recited in claim 20 wherein said each of said at least one capacitor further includes a fourth capacitor conductor, located on a fourth layer of said printed wiring board, that cooperates with said first, second and third capacitor conductors to employ said plate capacitance to store yet still further electrical energy.

* * * * *